(12) United States Patent
Choi et al.

(10) Patent No.: US 6,242,164 B1
(45) Date of Patent: *Jun. 5, 2001

(54) METHOD FOR PATTERNING CHEMICAL AMPLIFIED PHOTORESIST

(75) Inventors: Yong Kyoo Choi, Chungcheongbuk-do; Byeong Chan Kim, Kyungki-do, both of (KR)

(73) Assignee: Hyundai Electronics Industries Co., Ltd., Ichon-shi (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/061,032

(22) Filed: Apr. 16, 1998

(30) Foreign Application Priority Data

Aug. 20, 1997 (KR) .................................. 97-39727

(51) Int. Cl.⁷ ....................................... G03F 7/38
(52) U.S. Cl. .................. 430/325; 430/311; 430/313; 430/322
(58) Field of Search .................. 430/311, 313, 430/322, 325

(56) References Cited

U.S. PATENT DOCUMENTS 5,258,266 * 11/1993 Tokui et al. .................. 430/326
5,871,886 * 2/1999 Yu et al. .................. 430/316

FOREIGN PATENT DOCUMENTS

| 19825039 | * | 4/1999 | (DE) . |
| 487 749 A1 | * | 6/1992 | (EP) . |
| 07086119 | * | 3/1995 | (JP) . |
| 7-106235 | * | 4/1995 | (JP) . |
| 7-240365 | * | 9/1995 | (JP) . |

OTHER PUBLICATIONS

American Chemical Society, Washington D.C. 1994, "Introduction to Microlithography", pp. 212–233.

* cited by examiner

Primary Examiner—Mark F. Huff
Assistant Examiner—Nicole Barreca
(74) Attorney, Agent, or Firm—Fleshner & Kim, LLP

(57) ABSTRACT

Disclosed is a method for patterning a chemical amplified photoresist which improves resolution by adjusting a diffusion direction of photo acid. The method for patterning a chemical amplified photoresist includes the steps of depositing a chemical amplified photoresist on an etching target layer, selectively exposing the chemical amplified photoresist to generate photo acid on a surface of the exposed chemical amplified photoresist, diffusing the photo acid in only one direction by performing PEB process on condition that electric field is applied to the chemical amplified photoresist, and patterning the chemical amplified photoresist by developing process to remove only a portion where the photo acid is diffused.

16 Claims, 5 Drawing Sheets

METHOD FOR PATTERNING CHEMICAL AMPLIFIED PHOTORESIST

1. Field of the Invention

The present invention relates to a chemical amplified photoresist, and more particularly, to a method for patterning a chemical amplified photoresist which improves resolution by adjusting a diffusion direction of photo acid.

2. Discussion of the Related Art

A chemical amplified photoresist was published by IBM ten years ago. Using such a chemical amplified photoresist, a DRAM of 1M bit has been manufactured in 1990. LSI manufacturers and research institutions thereof have actively studied the chemical amplified photoresist for application to process. Generally, the chemical amplified photoresist includes a base resin, a light emitting agent, and the like. The chemical amplified photoresist sometimes includes a solubilization-inhibiting agent and a cross-linking agent.

The chemical amplified photoresist is used for the formation of a mask pattern of high resolution in response to catalytic chain reaction caused by diffusion of photo acid generated in the photoresist due to exposure.

A conventional method for patterning a chemical amplified photoresist will be described with reference to the accompanying drawings.

FIG. 1a to FIG. 1d are sectional views illustrating a conventional method for patterning a chemical amplified photoresist.

As shown in FIG. 1a, a chemical amplified photoresist 2 is deposited on an etching target layer 1.

As shown in FIG. 1b, the chemical amplified photoresist 2 is selectively exposed using an exposure mask. In the chemical amplified photoresist 2, photo acid is produced by exposure process of $\lambda$=365 nm, 248 nm, 193 nm.

Subsequently, as shown in FIG. 1c, the photo acid is diffused by post exposure baking (PEB) process of the selectively exposed chemical amplified photoresist 2. That is, the photo acid is diffused into an exposure region in the chemical amplified photoresist 2 by PEB process. As a result, the photo acid rapidly increases solubility for alkaline aqueous solution of the base resin, for example, solubility for poly hydroxy styrene (PHS).

As shown in FIG. 1d, the chemical amplified photoresist 2 is developed to form a mask pattern layer for etching of the etching target layer 1.

As described above, the exposure region of the chemical amplified photoresist and its non-exposure region are formed by the exposure and PEB processes, and selectivity ratio of the base resin in the exposure region and the non-exposure region is generated, so that a specific pattern can be achieved by the developing process.

In the chemical amplified photoresist, as the photo acid of a small quantity generated in exposure process is diffused by thermal energy generated in PEB process, catalytic chain reaction of several tens of times to several hundreds of times is induced. The solubility for alkaline aqueous solution of the base resin is increased by such catalytic chain reaction. That is, since enhanced amplified effect of the photoresist can be achieved by the photo acid of a small quantity, the chemical amplified photoresist can be patterned in high resolution.

The conventional method for patterning the chemical amplified photoresist will be described in detail.

The photo acid produced by exposure process is diffused into the photoresist at a distance of about 100–200 nm by PEB process performed under the conditions of temperature between 90° C. and 150° C. and time period of 90–120 sec. Chemical reaction between the base resin of the photoresist and t-butoxy carbonated poly hydroxy styrene (t-BOC) is then induced. As a result, poly hydroxy styrene, $CO_2$, isobutane, and photo acid ($H^+$) are generated. In the above process, poly hydroxy styrene separated from t-BOC is easily dissolved in alkaline aqueous solution, and a chain of reactions may be induced by the newly generated photo acid ($H^+$).

The conventional method for patterning the chemical amplified photoresist has several problems.

When the photo acid is diffused by PEB process, the photo acid is diffused in a horizontal direction as well as a vertical direction. This induces chemical reaction in the non-exposure region. If chemical reaction by diffusion of the photo acid is induced in the non-exposure region, latent image contrast is deteriorated, thereby causing ununiform pattern profile of the chemical amplified photoresist and deteriorating resolution.

SUMMARY OF THE INVENTION

Accordingly, the present invention is directed to a method for patterning a chemical amplified photoresist that substantially obviates one or more of the problems due to limitations and disadvantages of the related art.

An object of the present invention is to provide a method for patterning a chemical amplified photoresist which improves resolution by adjusting diffusion directions of photo acid.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for patterning a chemical amplified photoresist according to the present invention includes the steps of depositing a chemical amplified photoresist on an etching target layer, selectively exposing the chemical amplified photoresist to generate photo acid on a surface of the exposed chemical amplified photoresist, diffusing the photo acid in only one direction by performing PEB process on condition that electric field is applied to the chemical amplified photoresist, and patterning the chemical amplified photoresist by developing process to remove only a portion where the photo acid is diffused.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A method for patterning a chemical amplified photoresist according to the present invention is intended that photo acid is diffused in only a specific direction.

The method for patterning a chemical amplified photoresist according to the present invention will be described with reference to FIG. 2a to FIG. 2e.

Figure 1A:
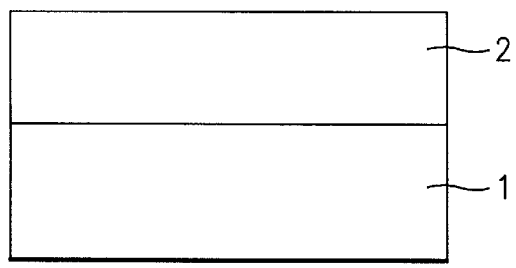
FIG. 1a to FIG. 1d are sectional views illustrating a conventional method for patterning a chemical amplified photoresist.
Figure 1B:
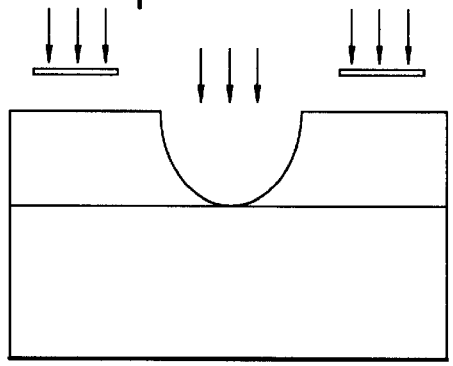
Figure 1C:
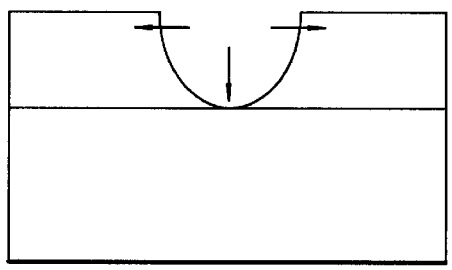
Figure 1D:
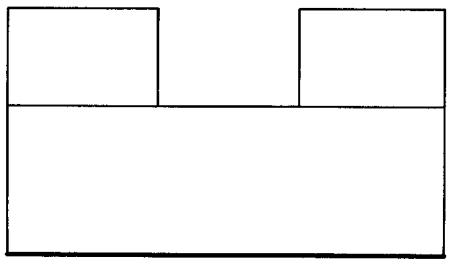
Figure 2A:
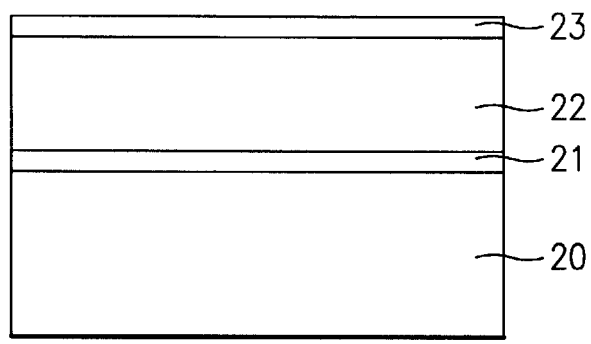
FIG. 2a to FIG. 2e are sectional views illustrating a method for patterning a chemical amplified photoresist according to the present invention.

As shown in FIG. 2a, a lower conductive thin film 21 is formed on an etching target layer 20. A chemical amplified photoresist 22 is deposited on the lower conductive thin film 21. At this time, an anti-reflective material is used as the lower conductive thin film 21, which prevents diffused reflection of light by the etching target layer 20 during exposure process and is easily removed by developing solution or dry etching.

Subsequently, an upper conductive thin film 23 is formed on the chemical amplified photoresist 22. A material which is easily removed by developing solution or the like is used as the upper conductive thin film 23. The upper conductive thin film 23 serves as an anti-reflective coating film which prevents diffused reflection of light by the etching target layer 20 during exposure process. In addition, a material which transmits all of light during exposure process is used as the upper conductive thin film 23.

At this time, if a conductive substrate such as polysilicon, polycide, or metal is used as the etching target layer 20, the chemical amplified photoresist 22 is deposited on the etching target layer 20 without forming the lower conductive thin film 21, so that the etching target layer can be used as the lower conductive thin film which applies electric field. However, if an insulating film such as an oxide film and a nitride film is used as the etching target layer 20, the lower conductive thin film 21 is formed.

Figure 2B:
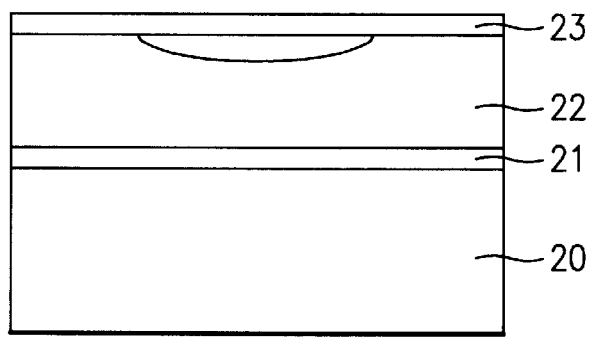

As shown in FIG. 2b, the chemical amplified photoresist 22 is selectively exposed to diffuse photo acid into the chemical amplified photoresist 22.

Figure 2C:
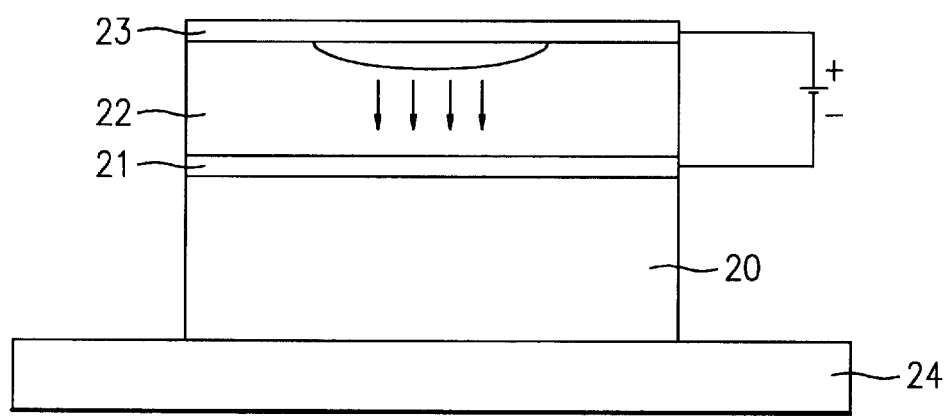

Thereafter, as shown in FIG. 2c, on condition that electric field is applied between the lower conductive thin film 21 and the upper conductive thin film 23, that is, on condition that low potential is applied to the lower conductive thin film 21 or the etching target layer 20, the photo acid is diffused in a vertical direction by PEB process to induce catalytic chain chemical reaction. At this time, a heater 24 is operated at the lower portion of the etching target layer 20 to adjust temperature during PEB process.

In PEB process, since the photo acid is $H^+$ ion of positive charge, the photo acid is diffused in a direction of the lower conductive thin film 21 having low potential.

Figure 2D:
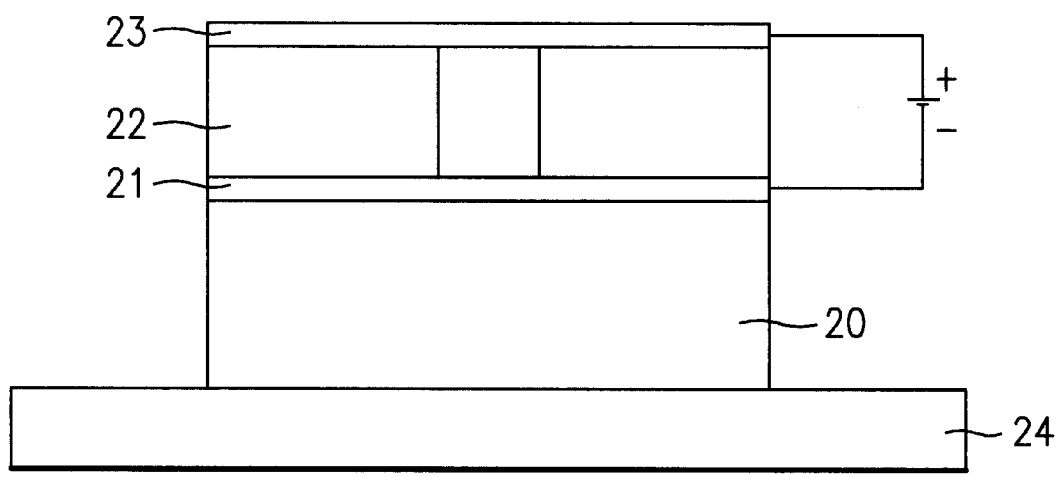

As shown in FIG. 2d, the upper conductive thin film 23 is removed, and the chemical amplified photoresist 22 in which the photo acid is diffused in a vertical direction is patterned by developing process.

Figure 2E:
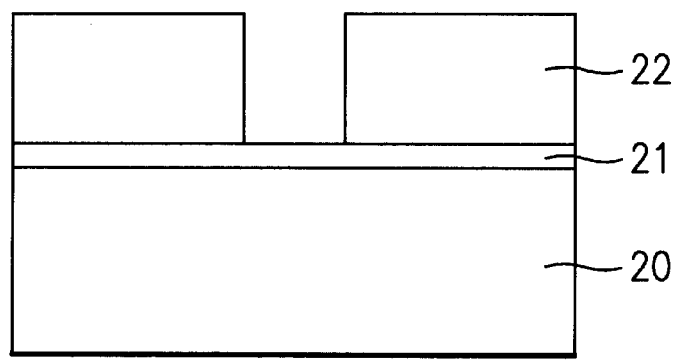

As shown in FIG. 2e, if the lower conductive thin film 21 is not removed by developing process, it is removed by additional process.

In the aforementioned method for patterning the chemical amplified photoresist, conductive thin films are formed at the lower and upper portions of the chemical amplified photoresist to apply electric field thereinto.

In another method for patterning the chemical amplified photoresist, which will be described below, separate electric field applying system is respectively formed at lower and upper portions of a wafer to apply electric field thereinto.

FIG. 3a to FIG. 3e are sectional views illustrating another method for patterning the chemical amplified photoresist according to the present invention.

Figure 3A:
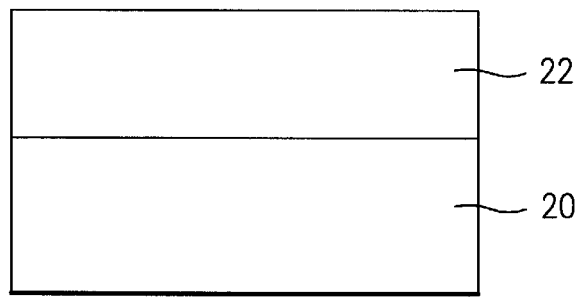
FIG. 3a to FIG. 3e are sectional views illustrating another method for patterning a chemical amplified photoresist according to the present invention.

As shown in FIG. 3a, a chemical amplified photoresist 22 is deposited on an etching target layer 20.

Figure 3B:
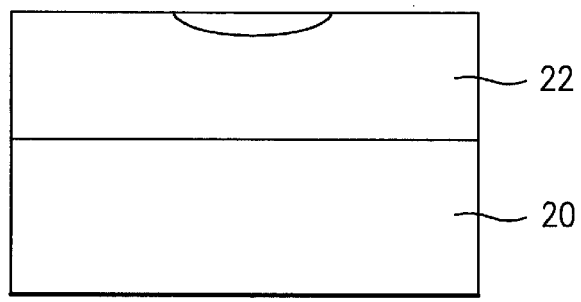

As shown in FIG. 3b, the chemical amplified photoresist 22 is selectively exposed so that photo acid can be diffused into the chemical amplified photoresist 22.

Figure 3C:
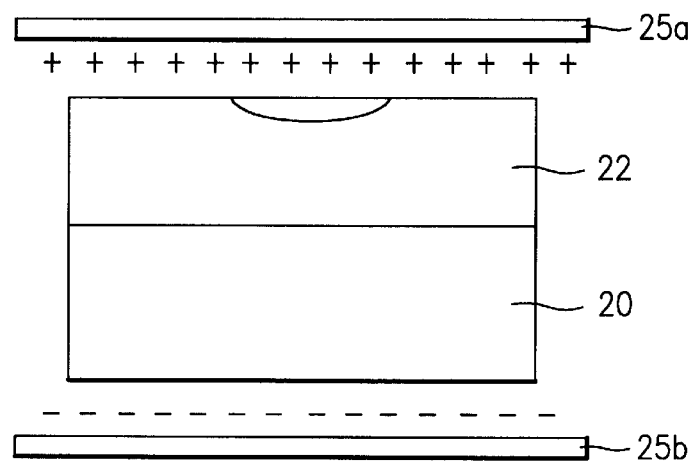

Subsequently, as shown in FIG. 3c, electric field applying systems 25a and 25b for applying electric field to lower and upper portions of the etching target layer 20 (a wafer or resulting material formed on the wafer) are operated and PEB process is performed. As a result, as the photo acid is diffused in the vertical direction, catalytic chain chemical reaction is induced. At this time, the electric field applying systems 25a and 26a are mounted in PEB equipment and include electrodes having the same size and shape as the wafer.

Figure 3D:
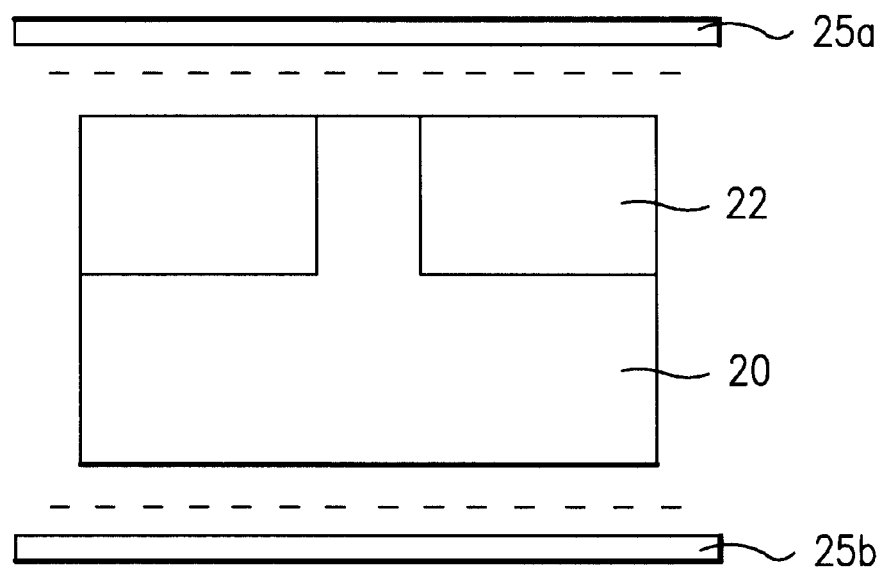

As shown in FIG. 3d, since the photo acid diffused by PEB process is $H^+$ of positive charge, the photo acid is diffused into a direction of the electric field applying system 25b having low potential, which is formed at the lower portion of the etching target layer 20

Figure 3E:
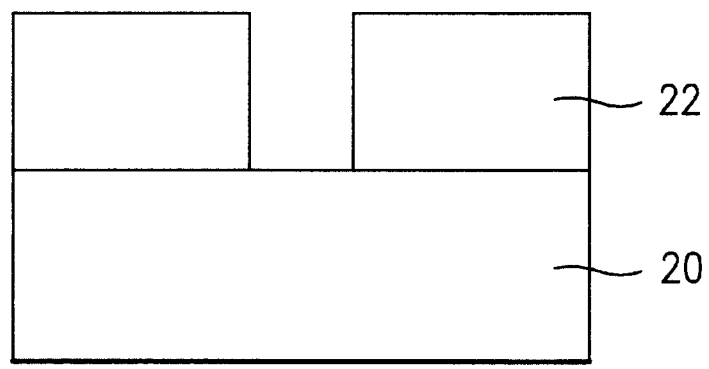

As shown in FIG. 3e, the chemical amplified photoresist 22 in which the photo acid is diffused in the vertical direction is patterned by developing process.

As aforementioned, the methods for patterning the chemical amplified photoresist according to the present invention have the following advantages.

Since diffusion direction of the photo acid which is diffused during patterning the chemical amplified photoresist is controlled in a specific direction, poor pattern due to lateral diffusion of the photo acid can be reduced and pattern having excellent resolution can be formed.

Since the top portion of the chemical amplified photoresist is only exposed, top surface imaging (TSI) effect can be achieved and notching due to reflection of the substrate can be reduced.

In addition, since the photoresist does not have any limitation in its thickness, good process margin can be achieved.

It will be apparent to those skilled in the art that various modifications and variations can be made in the method for patterning a chemical amplified photoresist of the present invention without departing from the spirit or scope of the invention. Thus, it is intended that the present invention cover the modifications and variations of the invention provided they come within the scope of the appended claims and their equivalents.

What is claimed is:

1. A method for patterning a chemical amplified photoresist comprising:

forming a lower conductive thin film on an etching target layer;

depositing a chemical amplified photoresist on the lower conductive thin film;

depositing an upper conductive thin film on the chemical amplified photoresist;

selectively exposing the chemical amplified photoresist through the upper conductive thin film to generate photo acid on a surface of the exposed chemical amplified photoresist;

diffusing the photo acid in one direction by a post exposure baking (PEB) process while an electric field is generated in the chemical amplified photoresist through application of a first potential to the upper conductive thin film and application of a second potential to the lower conductive thin film; and patterning the chemical amplified photoresist by a developing process to remove only a portion where the photo acid is diffused.

2. The method for patterning a chemical amplified photoresist as claimed in claim 1, wherein to generate the electric field, a high potential is applied to the upper conductive thin film and a low potential is applied to the lower conductive thin film.

3. The method for patterning a chemical amplified photoresist as claimed in claim 1, wherein the lower and upper conductive thin films are formed of a material which can be removed by a developing solution or dry etching.

4. The method for patterning a chemical amplified photoresist as claimed in claim 3, wherein the upper conductive thin film is formed of a material which transmits light during an exposure process.

5. The method for patterning a chemical amplified photoresist as claimed in claim 1, wherein the upper conductive thin film can be used as an anti-reflective coating film during an exposure process.

6. The method for patterning a chemical amplified photoresist as claimed in claim 1, wherein, for temperature adjustment in PEB process, a heater is operated at the lower portion of the etching.

7. A method for patterning a chemical amplified photoresist comprising:

forming a first electrically conductive film on an etching target layer;

depositing a chemical amplified photoresist on the first electrically conductive film;

depositing a second electrically conductive film on the chemical amplified photoresist wherein the second electrically conductive film transmits light;

selectively exposing the chemical amplified photoresist through the second electrically conductive film to generate photo acid on a surface of the exposed chemical amplified photoresist;

diffusing the photo acid in one direction by a post exposure baking process while generating an electric field in the chemical amplified photoresist, wherein the first and second electrically conductive films are used as electrodes to generate the electric field; and patterning the chemical amplified photoresist by a developing process to remove portions of the chemical amplified photoresist where the photo acid is diffused.

8. The method of claim 7, wherein the electric field is generated by applying a first electrical potential to the second electrically conductive film and a second electrical potential to the first electrically conductive film.

9. The method of claim 7, wherein the first and second electrically conductive films are formed of a material which can be removed by a developing solution or dry etching.

10. The method of claim 7, wherein the second electrically conductive film is used as an anti-reflective coating film during the exposure process.

11. The method of claim 7, wherein a heater is operated at the lower portion of the etching target layer to apply heat to the chemical amplified photoresist during the diffusing step.

12. A method for patterning a chemical amplified photoresist comprising:

depositing a chemical amplified photoresist on an etching target layer;

depositing an selectively exposing the chemical amplified photoresist through the electrically conductive film to generate photo acid on a surface of the exposed chemical amplified photoresist;

diffusing the photo acid substantially in one direction by a post exposure baking process while generating an electric field in the chemical amplified photoresist, wherein the electrically conductive film is used as a first electrode and the etching target layer is used as a second electrode to generate the electric field; and patterning the chemical amplified photoresist by a developing process to remove portions of the chemical amplified photoresist where the photo acid is diffused.

13. The method of claim 12, wherein the electrically conductive film is formed of a material which can be removed by a developing solution or dry etching.

14. The method of claim 13, wherein the electrically conductive film is formed of a material which transmits all light during the exposure process.

15. The method of claim 12, wherein the electrically conductive film is used as an anti-reflective coating film during the exposure process.

16. The method of claim 12, wherein the electric field is generated by applying a first potential to the electrically conductive film and a second potential to the etching target layer.

* * * * *